ELECTROMETER UTILIZING A DUAL PURPOSE FIELD-EFFECT TRANSISTOR

Filed April 3, 1964 3 Sheets-Sheet 1

INVENTOR.
JAMES E. YOUNG
BY Anthony W. Cunano
Stanley Z. Cole
ATTORNEY

ELECTROMETER UTILIZING A DUAL PURPOSE FIELD-EFFECT TRANSISTOR

Filed April 3, 1964 3 Sheets-Sheet 2

INVENTOR
JAMES E. YOUNG
BY Anthony D. Cennamo
Stanley Z. Cole
ATTORNEY

ELECTROMETER UTILIZING A DUAL PURPOSE FIELD-EFFECT TRANSISTOR

Filed April 3, 1964 3 Sheets-Sheet 3

INVENTOR.
JAMES E. YOUNG
BY Anthony D. Cennamo
Stanley Z. Cole
ATTORNEY

United States Patent Office 3,404,341
Patented Oct. 1, 1968

3,404,341

ELECTROMETER UTILIZING A DUAL PURPOSE FIELD-EFFECT TRANSISTOR

James E. Young, Pittsford, N.Y., assignor to Xerox Corporation, Rochester, N.Y., a corporation of New York Filed Apr. 3, 1964, Ser. No. 357,082
4 Claims. (Cl. 324—109)

ABSTRACT OF THE DISCLOSURE

A solid state electrometer utilizing a dual gate field effect transistor to obtain amplification and modulation of a voltage to be measured in a single stage and where one gate of the field effect transistor serves as the electrometer probe and the second gate of the field effect transistor is driven by an AC signal source to vary the internal capacitance of the field effect transistor to obtain a dynamic capacitor.

This invention relates to electrometers.

Electrometers are best known as test devices for sensing and measuring static voltages. As laboratory test instruments, the size and economy of these devices has not been critical. Today, electrometers are used for such varied purposes as continuous static voltage monitors in spacecraft, for example, neutral efflux detectors in ion propulsion engines, and for reading out electrostatic images as disclosed in U.S. Patent 2,583,546. Spacecraft use requires compactness and high reliability. Use in commercial equipment for reading images at high speed requires high resolution, and wide bandwidth. Further common requirements of electrometers are high input impedance, good signal stability, and a high signal to noise ratio. Perhaps the most common type of electrometer uses a vibrating reed driving a variable capacitor to obtain an AC voltage proportional to the charge being measured. This provides good signal stability and permits relatively simple AC amplification to be used in all stages. However, since the capacitor must be connected to the input lead ahead of the first amplification stage, the input impedance is lower than could be obtained with a direct isolated input to the first amplifying stage. This extra circuitry ahead of the first amplifying stage also increases noise pickup lowering the overall signal to noise ratio.

Now in accordance with the present invention, an electrometer has been devised in which a single solid state field effect transistor provides both the function of a vibrating capacitor and an AC amplifier. This enables an input pickup that is connected directly to the first active element with no other electrical connections. In combination with solid state amplifying, impedance matching and demodulating circuits, an electrometer is provided having smaller size and weight as well as improved signal to noise ratio and higher impedance as compared with present conventional electrometers. As will be obvious from the following disclosure, these advantages are obtained with simple circuitry capable of economic manufacture. Thus, it is an object of the present invention to define an improved electrometer.

It is a further object to define a circuit in which a single field effect transistor serves the dual functions of a vibrating capacitor and an amplifier.

Further objects and features of the invention will become apparent while reading the following description in connection with the drawings wherein.

Figure 1:
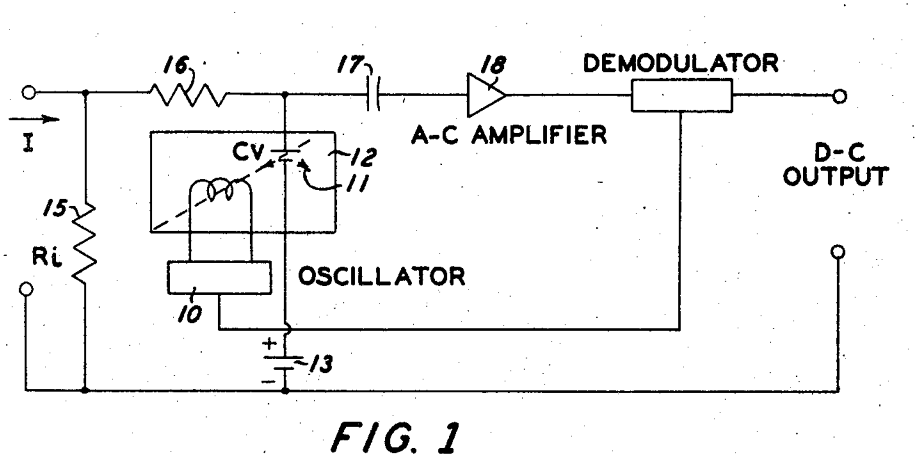
FIG. 1 is a simplified schematic of a prior art vibrating capacitor electrometer.

FIGURE 1 is a simplified schematic of a vibrating capacitor electrometer in accordance with the prior art. The basic sensing circuit in this electrometer consists of an oscillator 10 driving a mechanical reed connected to a movable plate 11 of capacitor 12, a DC voltage source 13, and a sensing transducer having an internal impedance represented by resistor 15. Source 13 charges capacitor 12 through the transducer impedance 15 and a voltage dropping resistor 16. With capacitor 12 at a fairly constant level of charge, movable plate 11 is vibrated by oscillator 10 changing the capacity of capacitor 12. The voltage on the capacitor varies in accordance with the relationship $Q=CE$ where $Q$=the quantity of charge in coulombs, $C$=the capacity in farads of the capacitor and $E$=the voltage across the capacitor in volts. With a very high RC time constant provided by impedance 15, resistance 16, and capacitor 12 combined with a relatively fast oscillatory rate of oscillator 10, the charge Q on capacitor 12 has little opportunity to vary and therefore may be considered constant. Thus, when the capacity of the capacitor varies by movement of plate 11, the voltage across the capacitor must go up and down in synchronism with the movement of plate 11. Thus, an AC voltage is developed which passes through capacitor 17 and is amplified by AC amplifier 18. When a static voltage is sensed by the transducer it adds to the charge on capacitor 12. In the relationship $Q=CE$, this means an increase in Q and a corresponding increase in E, with C remaining constant. Note that this is assuming the polarity of the sensed voltage is such as to add to the source voltage 13. With this increase in charge on capacitor 12, further variations in the capacitor due to the operation of oscillator 10 will produce an AC signal having a greater amplitude than before. This is true as it can be seen from the relationship $Q=CE$, that the amplitude of the AC voltage produced varies not only in proportion to the amplitude of the capacity variation, but also as a function of the charge on capacitor 12. The modulated AC signal thus produced and amplified by amplifier 18 may be demodulated by use of rectifiers and appropriate filters or as in the figure illustrated, by a synchronous demodulator which uses the vibrating reed oscillator 10 for a demodulating signal. Thus, a DC output is produced which is proportional to the static voltage sensed by the transducer.

The present invention uses a dual gate field effect transistor to function dually as both the AC amplifier 18 and variable capacitor 12 of FIGURE 1. This eliminates the need of circuitry ahead of the first amplifying stage and since field effect transistors are available in extremely small size, it can be placed in the head of the sensing transducer allowing reduction of length in the pickup lead prior to the first amplifying stage down to a fraction of an inch.

Figure 2:
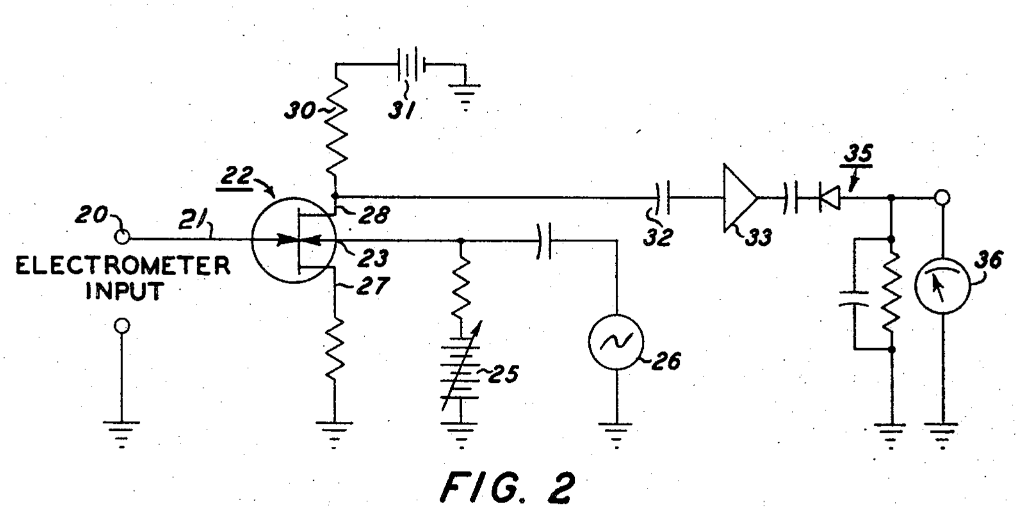
FIG. 2 is a simplified schematic of an electrometer in accordance with the invention.
Figure 5:
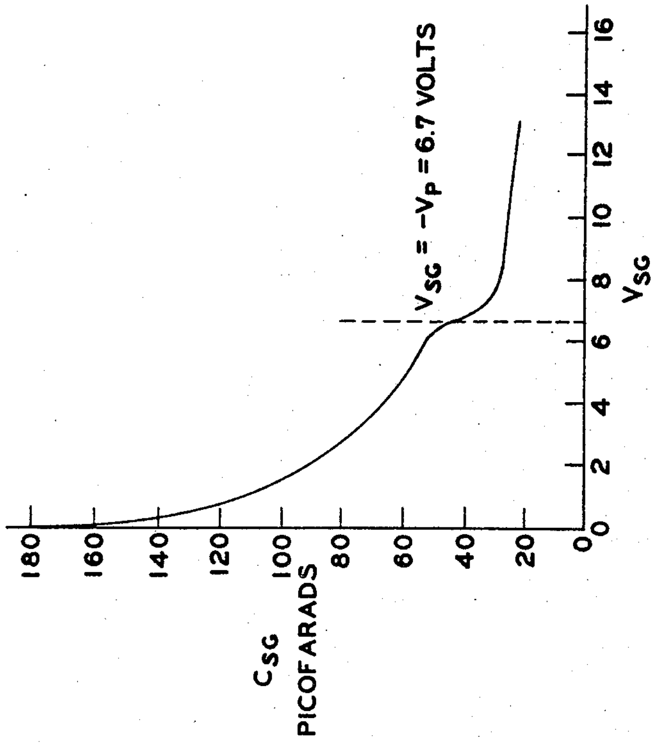
FIG. 5 is a graph showing voltage vs. capacity in a field effect transistor.

FIGURE 2 is a simplified circuit illustrating this device. The transducer input terminal is illustrated as 20 in FIGURE 2 with a direct lead into gate 21 of field effect transistor 22. The second gate 23 of transistor 22 is connected to a potential source 25 and an oscillator 26. In the past, it has been conventional to connect both gates of a field effect transistor directly together. However, recently there has been increased interest in operating these gates separately. For example, see the January 1963 issue of "Proceedings of the I.E.E.E." at p. 226 entitled "New Modes of Operation for Field Effect Devices." Potential source 25 biases gate 23 at a preset space charge depth of penetration, and the oscillator 26 varies this penetration in a sinusoidal manner. An input signal at 20 varies the space charge depth of penetration from gate 21 proportional to the sensed voltage. The AC signal from the oscillator at 23 and the input signal at 21 also vary the capacity between the gates and source electrode 27. A curve for a typical field effect transistor showing the variation in source to gate capacity ($C_{SG}$) with variation source to gate voltage ($V_{SG}$) is illustrated in FIGURE 5. While the graph illustrated in FIGURE 5 is made with both gates directly connected to each other as one would expect, an AC modulation applied to gate 23 provides a sinusoidal variation in the capacity between gate 23 and source 27, thereby providing the dynamic capacitor action obtained by the vibrating capacitor in FIGURE 1 as well as the normal voltage gain provided in a field effect transistor amplifying stage. The drain electrode 28 of transistor 22 is connected through a load resistor 30 to a DC source 31. The drain current through load resistor 30 becomes a function of source voltage 25 plus signal voltage from terminal 20, plus gain of transistor 22 and the voltage of oscillator 26. The output of transistor 22 is connected through a coupling capacitor 32 to amplifying stages 33 and then to a demodulator 35. As in the case of FIGURE 1, the output from the amplifying stages 33 may be connected to a synchronous demodulator operated by an output from oscillator 26, or to a rectifying type detector with appropriate filter circuits as illustrated to provide a DC output appropriate for operating a DC voltmeter 36.

Figure 3:
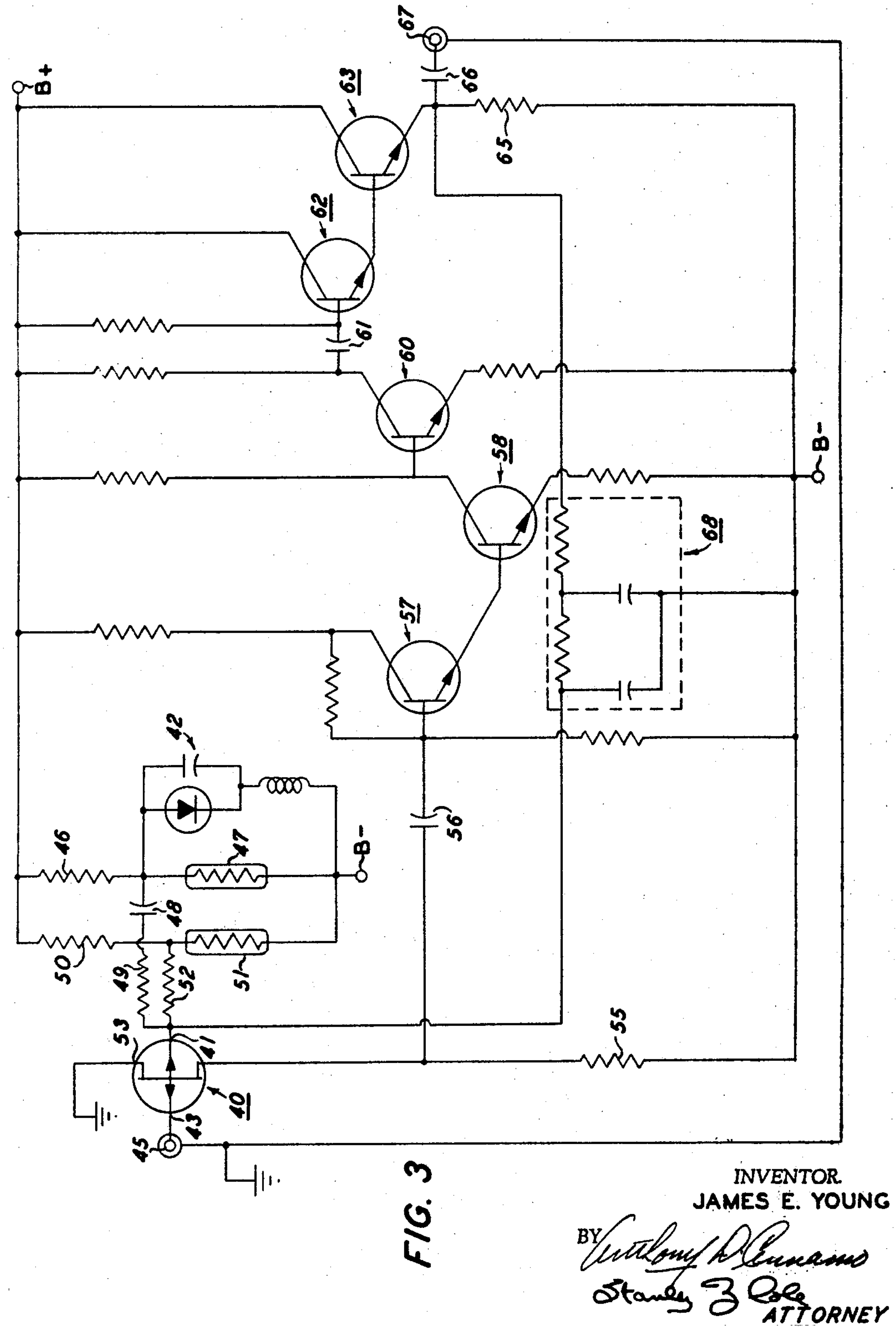
FIG. 3 is a complete schematic of an electrometer in accordance with the invention.

An exemplary embodiment of an electrometer amplifier using a field effect transistor in accordance with the invention is shown schematically in FIGURE 3. Field effect transistor 40 is driven at one gate 41 by a tunnel diode oscillator 42 and is driven at the second gate 43 by the voltage being measured as detected at probe 45. Oscillator 42 is a conventional tunnel diode oscillator of the negative resistance type. The voltage divider network comprising a resistor 46 and a thermistor 47 supplies proper bias to the tunnel diode. Thermistor 47 is selected with a temperature coefficient that will compensate for the effect of temperature change on the tunnel diode. Oscillator 42 is coupled to gate 41 through capacitor 48 and an isolating resistor 49. Transistor 40 is biased to about one half its maximum conduction current by the voltage divider comprising resistor 50 and thermistor 51. Thermistor 51 is selected to have the proper temperature coefficient to compensate for the effect of temperature on transistor 40. It should be noted that with some types of field effect transistors, the temperature dependance is very small and an ordinary resistor may be used instead of thermistor 51. For example, a silicon insulated gate field effect transistor has very low sensitivity to temperature change and is a desirable type for the present application. Resistor 52 is for isolation purposes. Field effect transistor 40 is illustrated as a P-channel type with the source electrode 53 connected to reference potential in common with the reference for probe 45. Gate 43 of the transistor is shown to be floating in order to maintain the highest possible impedance on the input. While a floating electrode will sometimes collect a static voltage, it has been found, in the present configuration, that unavoidable high impedance leakage paths apparently prevent any significant voltage build up on gate 43. In circuits where such a voltage build up becomes a problem, a simple momentary shorting switch can be used to remove the static voltage before using the instrument. The output of the field effect transistor is developed by load resistor 55 and coupled through a capacitor 56 to conventional amplifier circuitry comprising transistors 57, 58 and 60. The amplified voltage from transistor 60 is coupled by capacitor 61 to an impedance transforming circuit comprising transistors 62 and 63. Low impedance output from emitter follower 63 is developed across output resistor 65 and coupled through a coupling capacitor 66 to the output terminal 67 of the amplifier. From output terminal 67, connection may be made to a demodulating circuit and a voltmeter or other apparatus as desired. The output of emitter follower 63 is also connected back to gate 41 of the field effect transistor in a feedback circuit including a feedback network 68. Since many field effect transistors have a much higher gain at low frequencies, it has been found desirable in some applications to include an equalization network to flatten the frequency response over a given range. The circuit illustrated is operative with relatively inexpensive and readily available P-channel diffused silicon field effect transistors. For high frequency response and high input impedance, insulated gate thin film transistors (TFT) and metal oxide semiconductor transistors (MOST) are preferred. The MOST transistor is particularly preferable for electrometers requiring input impedances of $10^{15}$ ohms or better. The electrometer of FIGURE 3 was built to operate on an input signal of between 20 microvolts and 1000 microvolts. Voltage gain of 160 in the field effect transistor produced an output voltage signal at the drain electrode of 3.2 to 160 millivolts. For wide dynamic range with voltages running up over 1000 volts, conventional electrometer feedback techniques can be used in which the entire electrometer amplifier is floated on a demodulated feedback signal.

Figure 4:
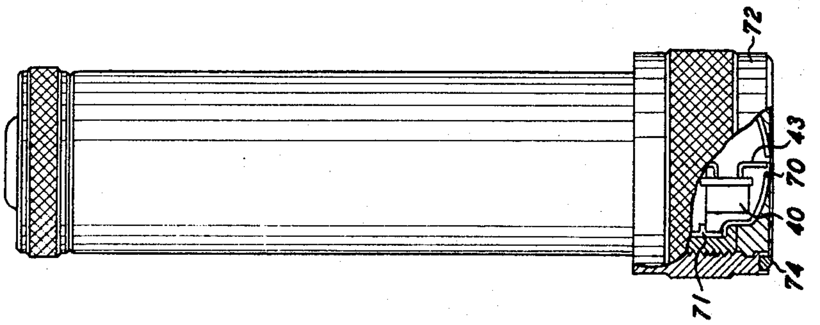
FIG. 4 is a front elevation and partial cut away of an electrometer in accordance with the invention.

The electrometer circuitry of FIGURE 3 readily fits into a small hand-held probe such as illustrated in full size in FIGURE 4. Field effect transistor 40 is mounted at the tip of the probe permitting electrode 43 to operate directly as the sensing element of the probe. A shield 70 surrounds the tip of electrode 43 and is directly connected to complete internal shielding 71 lining the entire inside of the probe. The short length of the sensing electrode 43 with its direct connection into the first amplifying stage provides low input capacity, high impedance and extremely low noise. The complete absence of connectors, flexible cable assemblies, and other parts susceptible to shielding defects during use are completely avoided prior to the primary amplifying stages in the present configuration.

Spacing between the sensing electrode 43 and an adjacent element having a voltage to be sensed is adjustable by means of the screw ring 72 at the sensing end of the probe. This screw ring is preferably made of an insulating material such as plastic, and, as can be seen in FIGURE 4, there is no mechanical connection with any of the probe shielding. In one experimental model, the entire outer case was made of anodized aluminum and screw ring 72, also of anodized aluminum, was further insulated for contact with a charge carrying surface by insert 74 of polytetrafluorethylene. The anodizing served to electrically insulate the case. Where extremely high resolution is desired, electrode 43 is tapered down to a fine point of 1 mil or less and is spaced from surrounding shielding 70 by a small bead of highly insulating material such as glass or polytetrafluorethylene.

While other solid state factors may be involved, it is believed that the operation of the present device is due to the variation in source to gate capacity with variation in source to gate voltage as graphically illustrated in FIGURE 5. In a MOST transistor this capacity variation under the electrometer operating conditions is from about .4 to 2 picofarads. This permits one gate of field effect transistor to be oscillator driven for a vibrating capacitor effect in the transistor, while the second gate, which is completely isolated for impedance purposes, can be used to sense an input signal and provide operation in the manner of a vibrating capacitor electrometer.

While the present invention has been described in terms of an electrometer, it should be apparent that it is also useful in a multitude of amplifying arrangements.

Thus, there is no intention to be limited by the specific embodiments described, but it is intended to cover the invention broadly within the spirit and scope of the appended claims.

What is claimed is:

1. A vibrating capacitor electrometer in which the vibrating capacity is effected internally of the first amplifying element comprising:

(a) a field effect transistor having at least a source electrode, a drain electrode, a first gate electrode and a second gate electrode;
(b) an operating potential source connected between said source electrode and said drain electrode;
(c) a biasing source connected between said first gate electrode and said source electrode for producing current flow between said source electrode and said drain electrode;
(d) an oscillator electrically connected between said first gate electrode and said source electrode for continuously varying the capacity between the first gate electrode and the source electrode and the second gate electrode and source electrode;
(e) a portion of direct lead from said second gate electrode arranged to serve as an electrometer pickup with said second gate electrode floating;
(f) output circuitry connected to said drain electrode; and,
(g) an indicating device connected to said output circuitry for producing an indicating representative of a voltage sensed by said second gate electrode.

2. A vibrating capacitor electrometer in which the vibrating capacity is effected internally of the first amplifying element comprising:

(a) a field effect transistor having a source electrode, a drain electrode, a first gate electrode and a second gate electrode;
(b) an operating potential source connected between said source electrode and said drain electrode;
(c) a biasing source connected between said first gate electrode and said source electrode for producing current flow between said source electrode and said drain electrode;
(d) an oscillator electrically connected between said first gate electrode and said source electrode for continuously varying the capacity between the first gate electrode and the source electrode and the second gate electrode and source electrode;
(e) input sensing means comprising an arrangement of a direct lead from said second gate electrode and shielding referenced in common with said lead;
(f) amplifier means coupled to said drain electrode;
(g) feedback means connected from the output of said amplifier means back to said first gate electrode; and,
(h) demodulating means connected to the output of said amplifier means for removing the oscillator modulation from the amplified signal.

3. An electrometer in which a first stage of amplification and capacitive modulation is combined in a single field effect transistor comprising:

(a) a field effect transistor having at least a source electrode, a drain electrode, a first gate electrode and a second gate electrode;
(b) an operating potential source connected between said source electrode and said drain electrode;
(c) a biasing source connected between said first gate electrode and said source electrode for producing current flow between said source electrode and said drain electrode;
(d) an oscillator connected to said first gate electrode in common with said biasing source for providing said capacitive modulation between the first gate electrode and the source electrode and the second gate electrode and source electrode;
(e) a portion of direct lead from said second gate electrode arranged to serve as an electrometer pickup with said second gate electrode floating;
(f) output circuitry including amplifier means connected to said drain electrode;
(g) a solid state active element impedance transformer connected to said amplifier means; and,
(h) an output terminal connected to said impedance transformer.

4. An electrometer according to claim 3 in which said oscillator is a negative resistance diode oscillator.

References Cited

UNITED STATES PATENTS

| | | | |
|---|---|---|---|
| 2,659,864 | 11/1953 | Rich et al. | 324—109 |
| 2,787,742 | 4/1957 | Fransen | 324—118 XR |
| 2,836,797 | 5/1958 | Ozarow. | |
| 3,158,027 | 11/1964 | Kibler. | |
| 3,170,126 | 2/1965 | Bento et al. | 332—56 XR |
| 3,204,160 | 6/1965 | Sah. | |
| 3,229,120 | 1/1966 | Carlson | 307—88.5 |

RUDOLPH V. ROLINEC, *Primary Examiner.*

E. F. KARLSEN, *Assistant Examiner.*